United States Patent
Ding

(10) Patent No.: US 6,967,507 B2
(45) Date of Patent: Nov. 22, 2005

(54) DUAL EDGE COUNT PROGRAMMABLE FREQUENCY DIVIDER

(75) Inventor: Lim Mao Ding, Taman Mahawangsa (MY)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/758,826

(22) Filed: Jan. 15, 2004

(65) Prior Publication Data

US 2005/0156638 A1    Jul. 21, 2005

(51) Int. Cl.[7] ............................................. H03K 21/00
(52) U.S. Cl. ........................................ 327/115; 377/48
(58) Field of Search ........................ 327/115, 117, 118; 377/47, 48, 107

(56) References Cited

U.S. PATENT DOCUMENTS

| | | | |
|---|---|---|---|
| 4,295,158 A * | 10/1981 | Nissen et al. ................ | 348/521 |
| 5,384,816 A * | 1/1995 | Prysby et al. ................. | 377/48 |
| 5,614,869 A * | 3/1997 | Bland .......................... | 331/1 A |
| 5,714,896 A * | 2/1998 | Nakagawa et al. ......... | 327/115 |
| 6,067,339 A * | 5/2000 | Knapp et al. ................. | 377/47 |
| 6,489,817 B1 * | 12/2002 | Wong et al. ................. | 327/115 |
| 6,861,881 B1 * | 3/2005 | Neravetla et al. ........... | 327/115 |

\* cited by examiner

Primary Examiner—Minh Nguyen

(57) ABSTRACT

A frequency divider having an input frequency divider, an edge counter, and an output generator. The input frequency divider generates an intermediate signal having a frequency of $f_i$ from an input signal having a frequency $f_{in}$, wherein $f_{in}=2f_i$. The edge counter generates a value equal to the number of edges in the intermediate signal that have occurred since a reset signal was generated. The output generator generates an output signal when the edge counter value reaches a value Q and generates the reset signal. In one embodiment, the edge counter includes a positive edge counter that counts the number of positive going transitions in the intermediate signal since the reset signal, a negative edge counter that counts the number of negative going transitions in the intermediate signal, and an adder that generates the sum of the positive and negative count values.

4 Claims, 5 Drawing Sheets

US 6,967,507 B2

DUAL EDGE COUNT PROGRAMMABLE FREQUENCY DIVIDER

FIELD OF THE INVENTION

The present invention relates to frequency dividers.

BACKGROUND OF THE INVENTION

Programmable frequency dividers are utilized in a number of electronic applications. To simplify the following discussion, the present invention will be explained in terms of a phase-locked loop (PLL) that utilizes such a divider. For example, microwave synthesizers are commonly used in test equipment to provide a test signal that sweeps a frequency range specified by the user. A microwave synthesizer can be designed using several approaches, depending on the performance requirements. The lowest cost approach utilizes a single phase-lock loop (PLL) design. In a single loop design, the output of the synthesizer is divided by a divider and compared against a reference frequency. Denote the division factor by $F_{div}$. When the loop is locked, the output frequency of the synthesizer is $F_{div}$ times the reference frequency.

A conventional programmable divider is constructed from a counter having a register constructed from a number of flip-flops and a comparator that determines when the counter reaches a predetermined state. For example, the counter can subtract one from the contents of the register on each clock pulse. The counter is initially loaded with $F_{div}$. When the counter reaches zero, the counter outputs a signal and reloads the register with $F_{div}$. The counter is decremented, for example, on the leading edge of the input signal.

In a conventional programmable divider, the input frequency $f_{in}$ is used to trigger all the flip-flops inside the divider. Hence, all the flip-flops have to operate at $f_{in}$. Hence, the frequency response of the counter flip-flops sets the upper limit on the maximum frequency at which the frequency divider can operate. As the frequency demands placed on microwave PLLs increase, the cost of providing higher frequency dividers becomes significant.

SUMMARY OF THE INVENTION

The present invention includes a frequency divider having an input frequency divider, an edge counter, and an output generator. The input frequency divider generates an intermediate signal having a frequency of $f_i$ from an input signal having a frequency $f_{in}$, wherein $f_{in}=Rf_i$, and R is an integer>1. The edge counter generates a value equal to the number of edges in the intermediate signal that have occurred since a reset signal was generated. The output generator generates an output signal when the edge counter value reaches a value Q and generates the reset signal. In one embodiment, the edge counter includes a positive edge counter that generates a positive count value equal to the number of positive going transitions in the intermediate signal since the reset signal, a negative edge counter that generates a negative count value equal to the number of negative going transitions in the intermediate signal since the reset signal, and an adder that generates the sum of the positive count and the negative count.

DETAILED DESCRIPTION OF THE PREFERRED EMBODIMENTS OF THE INVENTION

Figure 1:
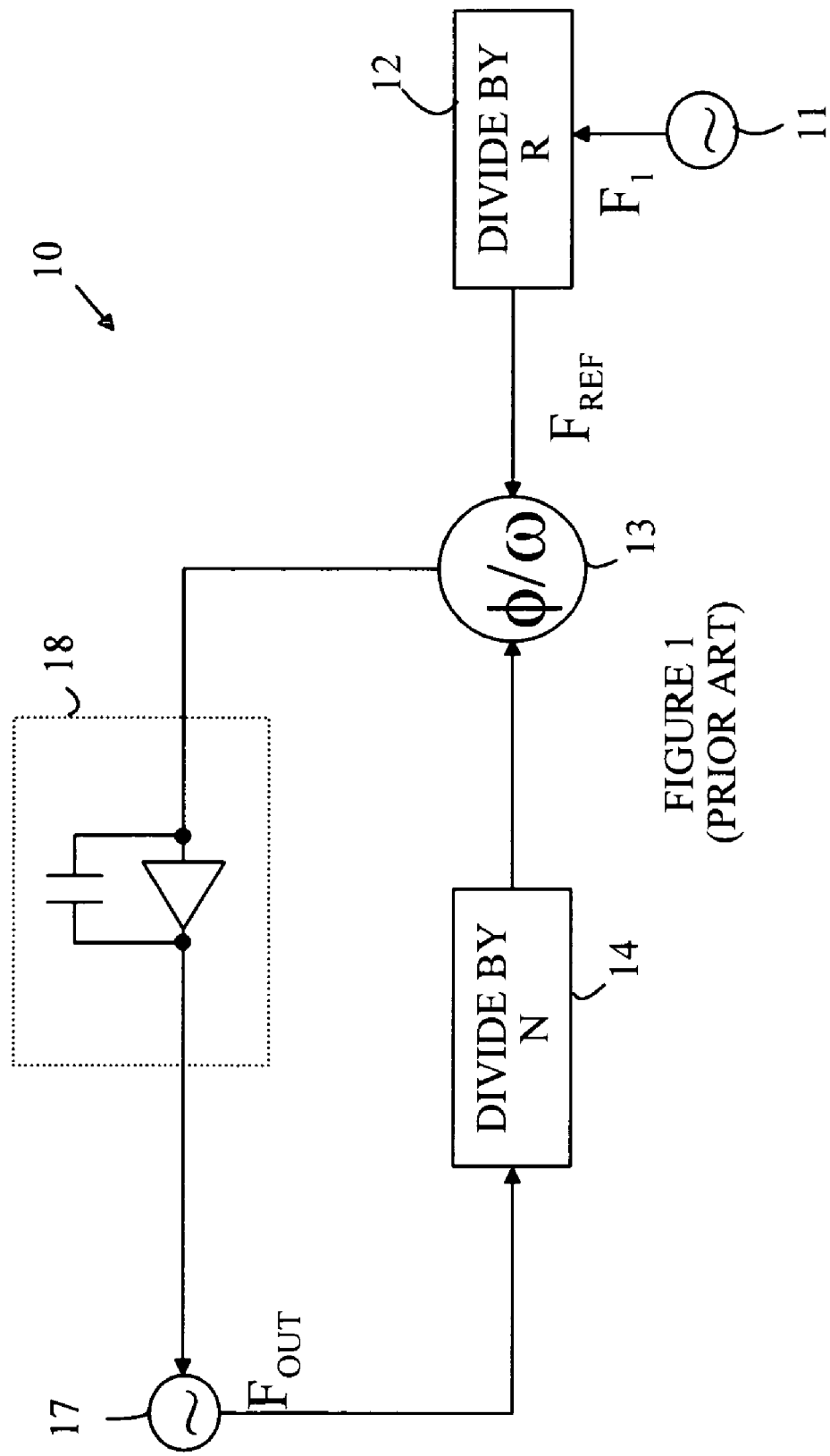
FIG. 1 is a block diagram of a prior art frequency synthesizer.

The present invention can be more easily understood with reference to FIG. 1, which is a block diagram of a prior art frequency synthesizer 10. Synthesizer 10 utilizes a YTO (Yttrium-Iron-Garnat Tuned Oscillator). A YTO is preferred because it provides a high quality microwave oscillator with a wide tuning range and excellent tuning linearity. YTO 17 is controlled by the output of integrator 18 to set the final output frequency $F_{out}$. The output frequency is divided by a factor of N by divider 14 to generate the signal that is compared with the reference signal $F_{ref}$ in phase detector 13. The reference signal is typically at a fixed frequency $F_{ref}$ generated by dividing the output of a high frequency reference signal generator 11 using a second divider 12.

Figure 2:
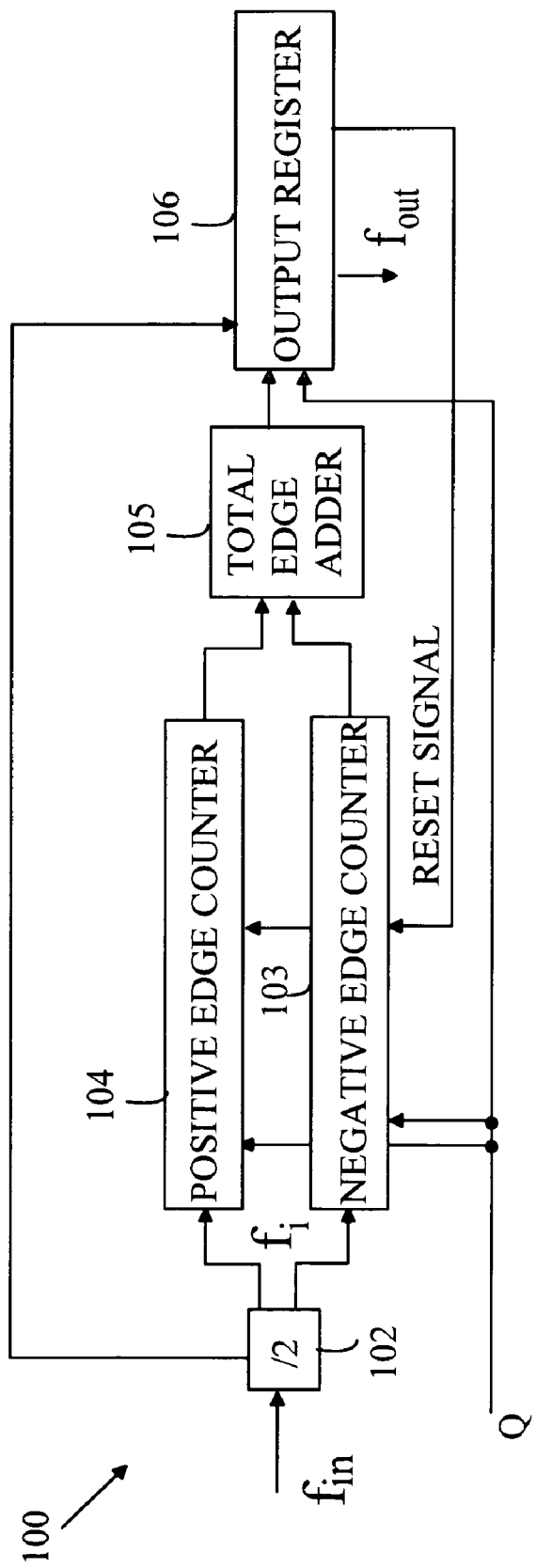
FIG. 2 is a block diagram of a frequency divider according to one embodiment of the present invention.
Figure 3:
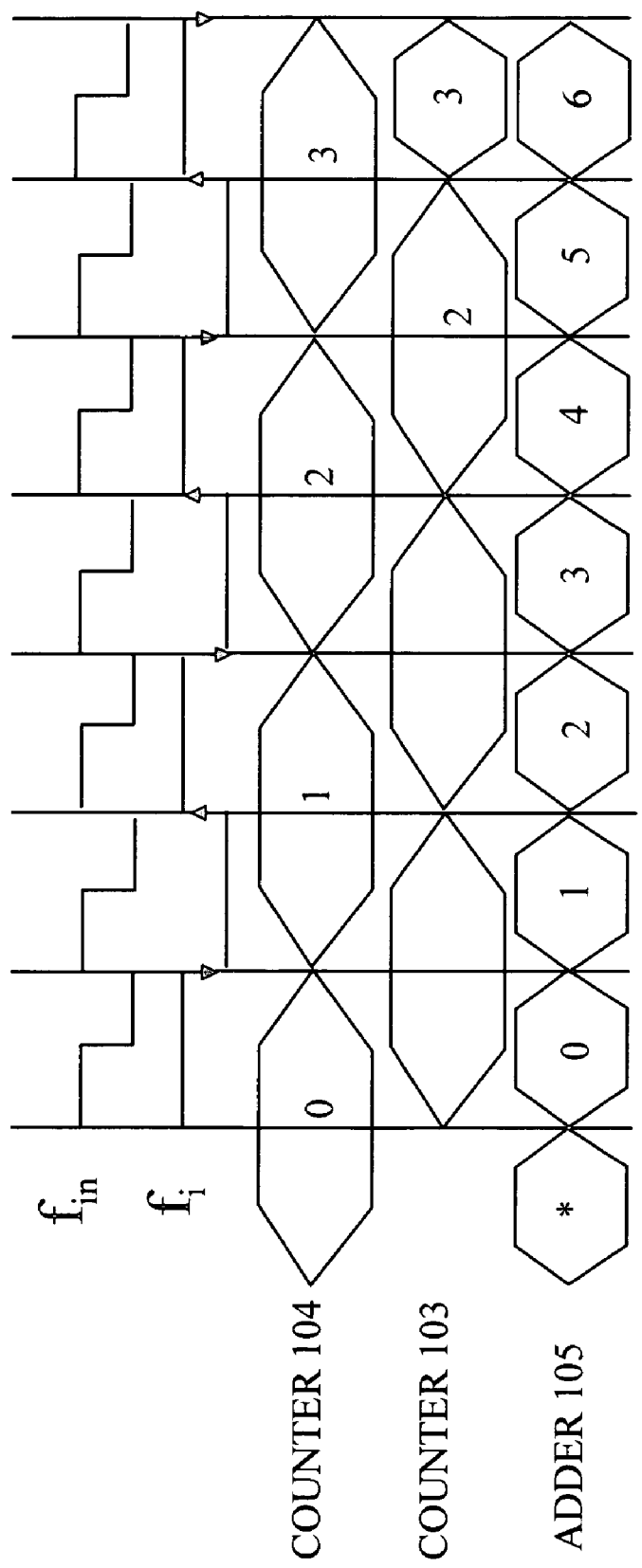
FIG. 3 illustrates the signals at various locations in the frequency divider shown in FIG. 2.

Refer now to FIGS. 2 and 3. FIG. 2 is a block diagram of a frequency divider 100 according to one embodiment of the present invention. Frequency divider 100 utilizes a divide by two circuit 102 to generate a signal having a frequency $f_i$ from the input signal $f_{in}$. Signal $f_i$ is a square wave. Signal $f_i$ is input to each of two counters 103 and 104, respectively. Counter 103 counts the negative edges in $f_i$, and counter 104 counts the positive edges in $f_i$. The sum of the contents of counters 103 and 104 is formed by adder 105, which stores its output in a register in an output generator 106. When the count in this register is equal to Q, output generator 106 generates a signal that is synchronized to the input signal. Hence, the output of output generator 106 has frequency $f_{out}$, where $f_{out}=f_{in}/Q$. When output generator 106 generates the output signal, output generator 106 resets counters 103 and 104. The various signals and counter values are shown in FIG. 3. It should be noted that the present invention requires that the divide factor, Q, be greater than 1.

By using an edge count programmable frequency divider as shown in FIG. 2, the input frequency is divided by a factor of 2 first to generate the signal that is actually used by the counters. Hence, there are only 2 or 3 flip-flops that need to be triggered at the high input frequency, $f_{in}$, namely the two flip flops in the divide by two counter and the output flip flop of this counter. The other flip-flops are only required to operate at $f_{in}/2$. Hence, the present invention requires many fewer high-speed flip-flops.

The above-described embodiments have been explained in terms of a frequency divider. However, an edge-count divider according to the present invention can also be applied on other counters. The present invention divides a counter into two edge counters that operate at half the frequency of the input signal. One counter counts the positive edges and the other counter counts the negative edges. The counts in the two edge counters are then added to provide the final count. Only the divide by two circuit needs to operate at the input frequency; hence, the number of high-frequency flip flops is substantially reduced.

Figure 4:
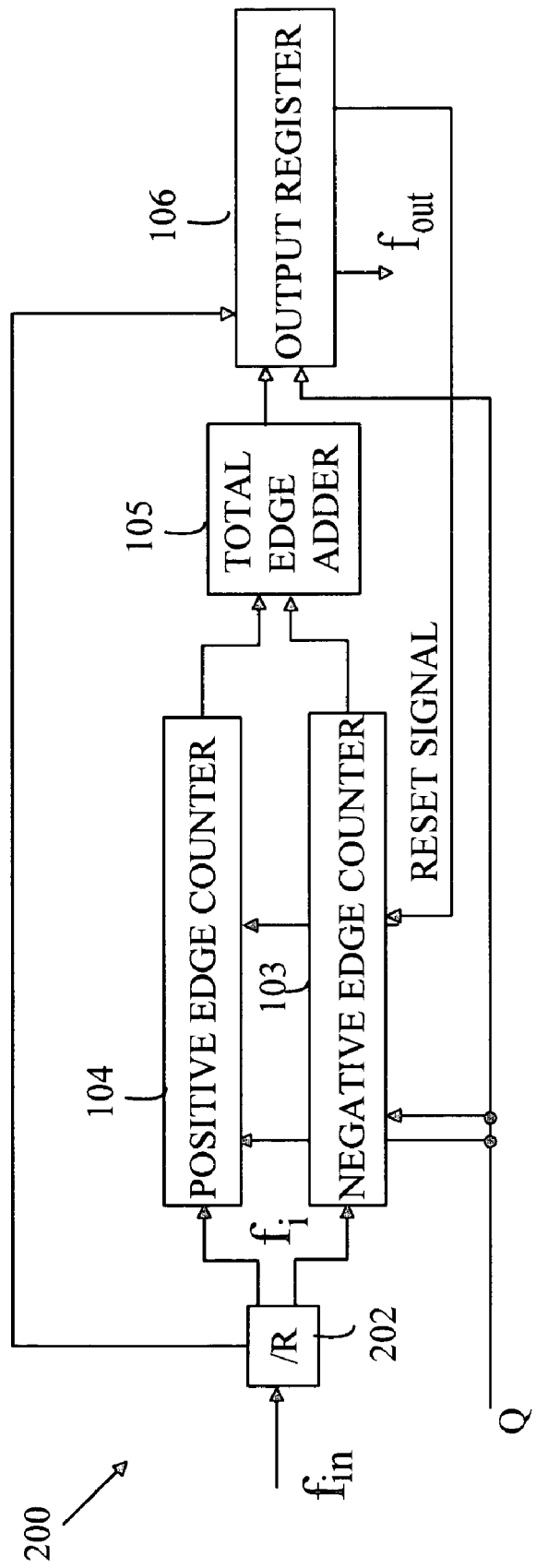
FIG. 4 is a block diagram of a frequency divider according to another embodiment of the present invention.
Figure 5:
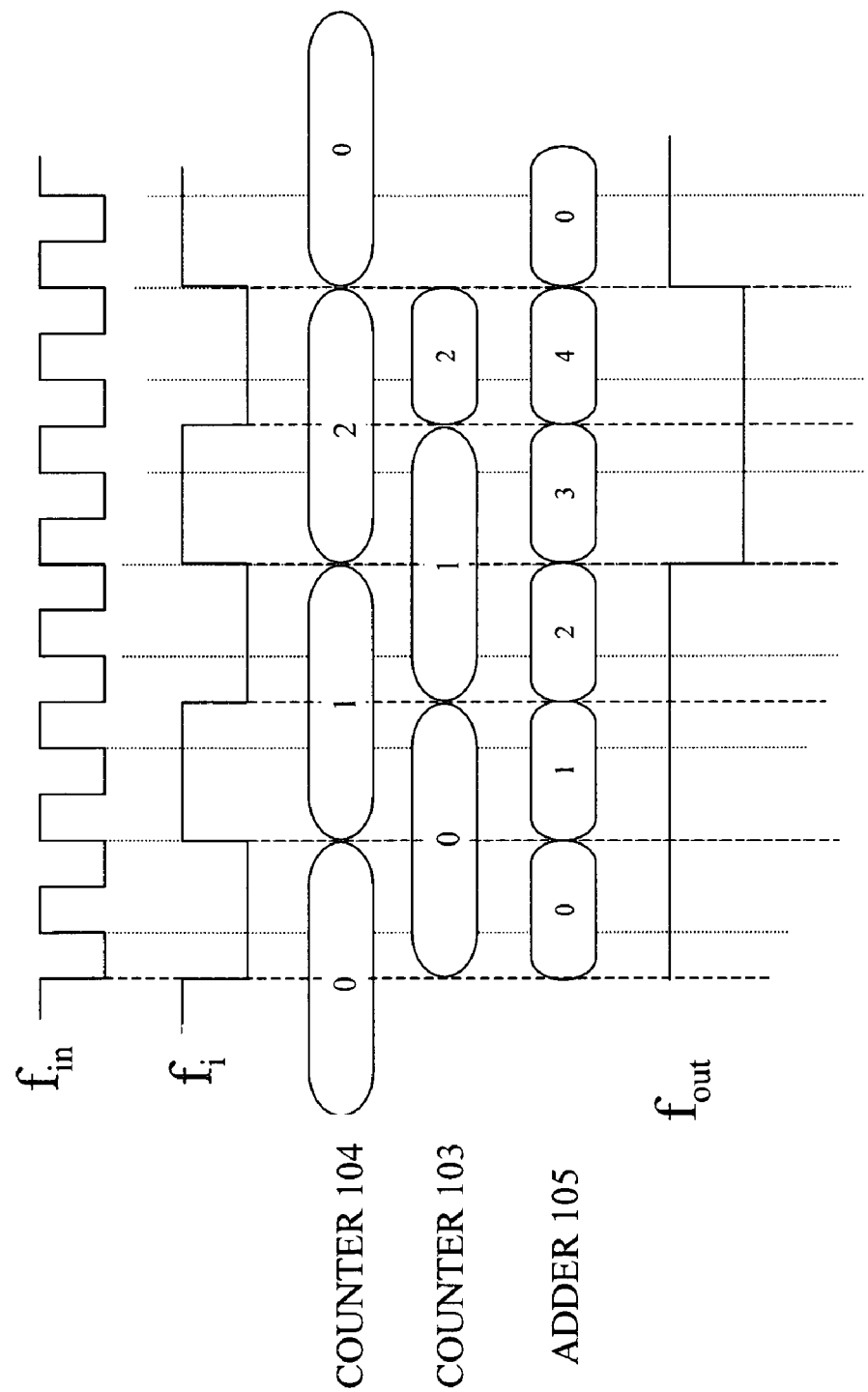
FIG. 5 illustrates the signals at various locations in the frequency divider shown in FIG. 4.

In principle, the embodiment shown in FIG. 2 can be generalized to provide a fractional divide circuit. Refer now to FIGS. 4 and 5, which illustrate a block diagram of an embodiment of the present invention that provides fractional division. To simplify the following discussion, those elements of frequency divider 200 that serve the same function as elements discussed above with reference to FIG. 2 have been given the same numeric designations and will not be discussed further here. In this more general embodiment, the divide by 2 shown in FIG. 2 at 102 is replaced by a divide by R circuit 202 where R is an integer. The total divide factor is given by (QR)/2, and the output frequency is given by $f_{out}=2f_{in}/(QR)$. For example, consider the case in which R=3 and Q=5, the divide factor would be 7.5 in this case. The various signals and counter values for this case are shown in FIG. 5.

The higher divide factor further reduces the frequency demands on the edge counters. However, the higher divide factor increases the cost of the divide circuit that converts $f_{in}$ to $f_i$. If R is small, a net saving is still realized.

Various modifications to the present invention will become apparent to those skilled in the art from the foregoing description and accompanying drawings. Accordingly, the present invention is to be limited solely by the scope of the following claims.

What is claimed is:

1. A frequency divider comprising:

an input frequency divider for generating an intermediate signal having a frequency of $f_i$ from an input signal having a frequency $f_{in}$, wherein $f_{in}=Rf_I$, R being an integer >1;

an edge counter that generates a value equal to the sum of the number of positive edges and the number of negative edges in said intermediate signal that have occurred since a reset signal was generated; and an output generator that generates an output signal when said edge counter value reaches a value Q and generates said reset signal.

2. The frequency divider of claim 1 wherein said output generator further comprises a port for receiving a signal specifying Q.

3. A frequency divider comprising:

an input frequency divider for generating an intermediate signal having a frequency of $f_i$ from an input signal having a frequency $f_{in}$, wherein $f_{in}=Rf_I$;

an edge counter that generates a value equal to the sum of the number of positive edges and the number of negative edges in said intermediate signal that have occurred since a reset signal was generated; and an output generator that generates an output signal when said edge counter value reaches a value Q and generates said reset signal, wherein R=2.

4. A frequency divider comprising:

an input frequency divider for generating an intermediate signal having a frequency of $f_i$ from an input signal having a frequency $f_{in}$, wherein $f_{in}=Rf_I$, R being an integer >1;

an edge counter that generates a value equal to the number of edges in said intermediate signal that have occurred since a reset signal was generated; and an output generator that generates an output signal when said edge counter value reaches a value Q and generates said reset signal;

wherein said edge counter comprises a positive edge counter that generates a positive count value equal to the number of positive going transitions in said intermediate signal since said reset signal; a negative edge counter that generates a negative count value equal to the number of negative going transitions in said intermediate signal since said reset signal; and an adder that generates the sum of said positive count and said negative count.

* * * * *